(12) United States Patent
Kuroyanagi

(10) Patent No.: US 8,620,469 B2
(45) Date of Patent: Dec. 31, 2013

(54) CARRIER SYSTEM AND METHOD FOR HANDLING CARRIED OBJECT USING THE SAME

(75) Inventor: Masaaki Kuroyanagi, Anjo (JP)

(73) Assignee: DENSO CORPORATION, Kariya (JP)

( * ) Notice: Subject to any disclaimer, the term of this patent is extended or adjusted under 35 U.S.C. 154(b) by 150 days.

(21) Appl. No.: 13/049,059

(22) Filed: Mar. 16, 2011

(65) Prior Publication Data

US 2011/0274521 A1 Nov. 10, 2011

(30) Foreign Application Priority Data

May 6, 2010 (JP) ................................ 2010-106273

(51) Int. Cl.
*G06F 19/00* (2011.01)
(52) U.S. Cl.
USPC ............................................ 700/112; 700/56
(58) Field of Classification Search
USPC ...................................... 700/56–59, 112–116
See application file for complete search history.

(56) References Cited

U.S. PATENT DOCUMENTS

| | | | |
|---|---|---|---|
| 6,665,595 B1 | 12/2003 | Goto et al. | |
| 6,788,992 B2 | 9/2004 | Ono | |
| 7,074,000 B2 * | 7/2006 | Englhardt | 414/217.1 |

FOREIGN PATENT DOCUMENTS

| | | |
|---|---|---|
| JP | A-07-330144 | 12/1995 |
| JP | A-2004-228443 | 8/2004 |
| JP | B2-3614312 | 11/2004 |
| JP | A-2006-282303 | 10/2006 |
| JP | B2-3917371 | 5/2007 |
| JP | B2-3982395 | 7/2007 |
| JP | A-2008-311419 | 12/2008 |

OTHER PUBLICATIONS

Office Action mailed Feb. 14, 2012 in corresponding JP Application No. 2010-106273 (and English translation).
Office Action dated Sep. 18, 2013 in the corresponding TW application No. 100109708 (English translation).

* cited by examiner

*Primary Examiner* — Carlos Ortiz Rodriguez
(74) *Attorney, Agent, or Firm* — Posz Law Group, PLC

(57) ABSTRACT

A processing equipment unit performs a predetermined process to a carried object. A case accommodates the carried object. A carrier carries the carried object in the case. An opener is configured to enable the carrier to mount the case on the opener. The opener includes an opener control unit configured to exchange a signal with the carrier to control elevation of the case. The carrier is configured to exchange a signal with the opener control unit thereby to mount the case on the opener. The opener is equipped to the processing equipment unit.

3 Claims, 3 Drawing Sheets

CARRIER SYSTEM AND METHOD FOR HANDLING CARRIED OBJECT USING THE SAME

CROSS REFERENCE TO RELATED APPLICATION

This application is based on and claims priority to Japanese Patent Application No. 2010-106273 filed on May 6, 2010, the contents of which are incorporated in their entirely herein by reference.

TECHNICAL FIELD

The present invention relates to a carrier system configured to transfer a carried object. The present invention further relates to a method for handling the carried object using the carrier system.

BACKGROUND

JP-A-2004-31579 discloses a carrier system including a processing equipment unit, a carrier, and an opener. The processing equipment unit performs a predetermined manufacturing process on a carried object such as a silicon wafer. The carrier carries the carried object accommodated in a case. The processing equipment unit is equipped with the opener configured to enable the carrier to mount the case on the opener. The processing equipment unit includes a processing-equipment control unit. The processing-equipment control unit in turn includes one control unit to control the manufacturing process and another control unit to control elevation of the case. The carrier includes a carrier-optical communication unit and is movable along a rail located to pass above the opener, while holding the carried object. The rail is equipped with a rail-optical communication unit located above the opener and configured to be paired with the carrier-optical communication unit. The rail-optical communication unit and the carrier-optical communication unit are configured to exchange signals therebetween when the carrier arrives at a position above the opener. The rail-optical communication unit is coupled with the processing-equipment control panel included in the processing equipment unit via a signal line. In the present configuration, when the carrier arrives at the position above the opener after moving along the rail, the carrier exchanges signal with the processing-equipment control panel via the rail-optical communication unit to mount the case on the opener.

It is noted that the processing equipment unit of the carrier system is equipped with the control unit configured to control elevation of the case. In such a configuration, when the processing equipment unit is replaced, the processing equipment unit needs to be equipped with a new processing-equipment control panel, which includes a control unit for controlling elevation of the case. Consequently, there is an associated replacement cost for the processing-equipment control panel each time the processing equipment unit of the carrier system is replaced. Further, in a case where the carrier system includes multiple processing equipment units, each of the processing equipment units includes its own processing-equipment control panel. In this case, each processing-equipment control panel has a control unit to control elevation of the case. Thus, there is an associated replacement cost for each processing-equipment control panel each time the processing equipment unit of the carrier system is replaced. Consequently, the present carrier system has a high associated manufacturing cost.

SUMMARY

In view of the above disadvantage, the present inventor studied the problems and noted that the opener need not be replaced when the processing equipment unit is replaced. In addition, the present inventor noted that, in a case where the carrier system includes multiple processing equipment units, the same openers are respectively equipped to the processing equipment units. Thus, the present inventor investigated and determined that it is sufficient to equip the opener with a control panel, which is for controlling elevation of the case.

According to one aspect, a carrier system comprises a processing equipment unit configured to perform a predetermined manufacturing process on a carried object. The carrier system further comprises a carrier configured to carry a carried object accommodated in a case. The carrier system further comprises an opener equipped to the processing equipment unit and configured to enable the carrier to mount the case on the opener. The opener includes an opener control panel configured to exchange a signal with the carrier to control elevation of the case. The carrier is further configured to exchange a signal with the opener control panel to mount the case on the opener.

According to another aspect, a method for handling a carried object, comprises causing a carrier to carry a case accommodating a carried object. The method further comprises causing a control unit included in an opener to exchange a signal with the carrier to control elevation of the case. The method further comprises causing the carrier to exchange a signal with the control unit to control mounting of the case on the opener. The method further comprises causing a processing equipment unit equipped with the opener to perform a predetermined manufacturing process on the carried object.

BRIEF DESCRIPTION OF THE DRAWINGS

The above and other objects, features and advantages will become more apparent from the following detailed description made with reference to the accompanying drawings. In the drawings.

DETAILED DESCRIPTION (First Embodiment)

As follows, a carrier system according to a first embodiment will be described with reference to drawings.

Figure 1:
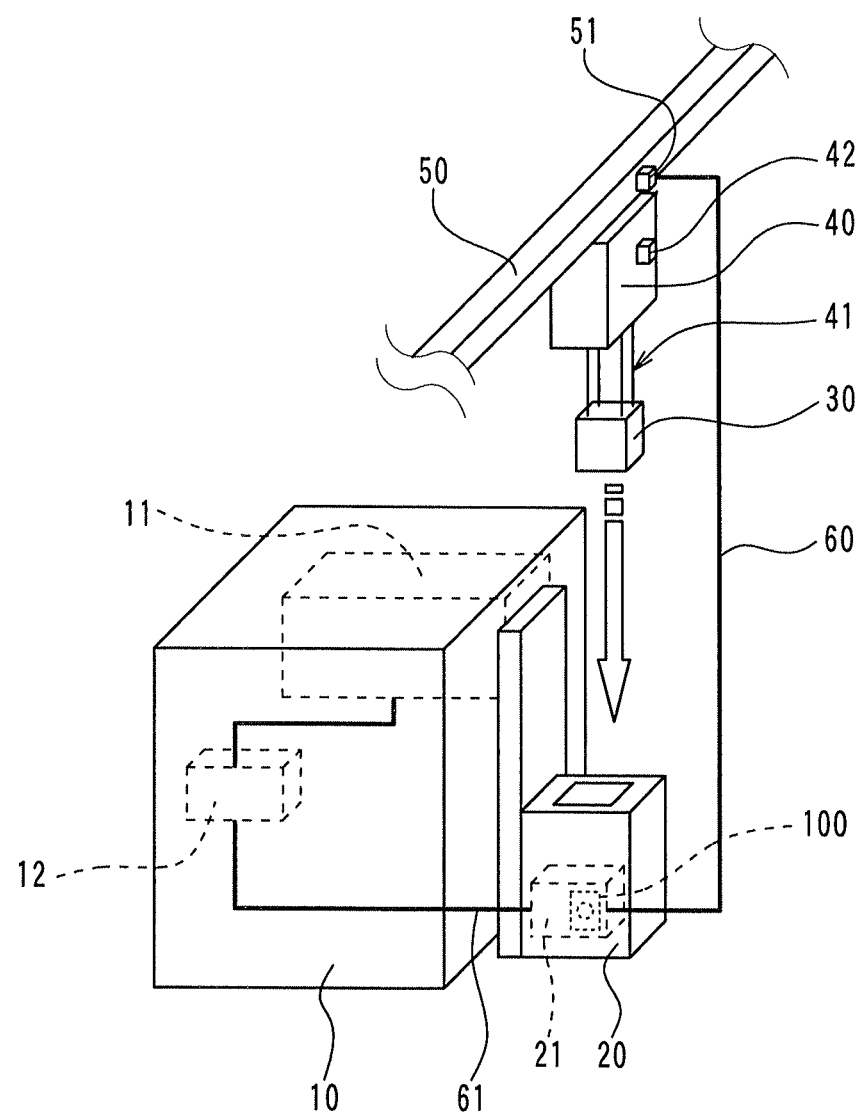
FIG. 1 is a perspective view showing a carrier system according to a first embodiment.

As shown in FIG. 1, the carrier system according to the present embodiment includes a processing equipment unit 10, an opener 20, and a carrier 40. The processing equipment unit 10 is equipped with the opener 20. The carrier 40 coveys a case 30, which accommodates a carried object such as a silicon wafer. The carrier 40 is configured to mount the case 30 on the opener 20 and lift up the case 30 from the opener 20.

The processing equipment unit 10 is configured to perform a predetermined manufacturing process to treat a carried object. When the carried object is a silicon wafer, the processing equipment unit 10 may be equipped with a processing chamber 11, which is for performing a manufacturing process such as etching and thermal treatment for a semiconductor, and a processing-equipment control panel 12 for controlling the manufacturing process.

The case 30 conveyed by the carrier 40 may be a generally-known standard mechanical interface (SMIF) or a front opening unified pod (FOUP). The case 30 includes a main body, a lid, and a flange. The main body has one face having an opening covered by the lid. The flange is equipped to the main body. The main body and the lid define an accommodation space therein to accommodate a carried object such as a silicon wafer. In FIG. 1, indication of the flange is omitted.

In the present embodiment, the carrier 40 is an overhead hoist transport (OHT) configured to move along a rail 50. The rail 50 is suspended from a ceiling of a factory. The carrier 40 includes a holder unit (not shown) and a suspension unit 41. The holder unit holds the flange of the case 30. The suspension unit 41 suspends the holder unit. The carrier 40 is configured to raise (e.g., to roll up) the suspension unit 41 and to lower (e.g., to release) the suspension unit 41 to hoist the holder unit and elevate the case 30. The carrier 40 has a main body equipped with an optical communication unit 42.

The rail 50 is configured to guide the carrier 40. The rail 50 is suspended from the ceiling of the factory and located to pass directly above the opener 20. The rail 50 is equipped with an optical communication unit 51, which is located above the opener 20 and configured to be paired with the optical communication unit 42 equipped to the carrier 40. The optical communication units 42, 51 are configured to be coupled with each other via an optical communication link to exchange signals therebetween.

The opener 20 is affixed to the processing equipment unit 10. Specifically, the opener 20 may be secured by screws or other fasteners to the processing equipment unit 10. The opener 20 is equipped with an opener control panel 21 including a control unit 100 configured to exchange signals with the carrier 40 so as to control elevation of the case 30. The opener control panel 21 is coupled with the optical communication unit 51 of the rail 50 and the processing-equipment control panel 12 via signal lines 60, 61 (as well as signal lines 62, 63 and 64 in the second embodiment shown in FIG. 3) and configured to perform, for example, parallel communications. In short, according to the present embodiment, the opener control panel 21 is configured to exchange signals with the optical communication unit 42 of the carrier 40 via the optical communication unit 51 of the rail 50. The opener 20 is not uniquely adapted to the processing equipment unit 10. That is, the opener 20 may be adapted to a processing facility other than the processing equipment unit 10 when being fixed to the processing facility.

As follows, an operation of the carrier system will be described with reference to FIG. 2.

Figure 2:
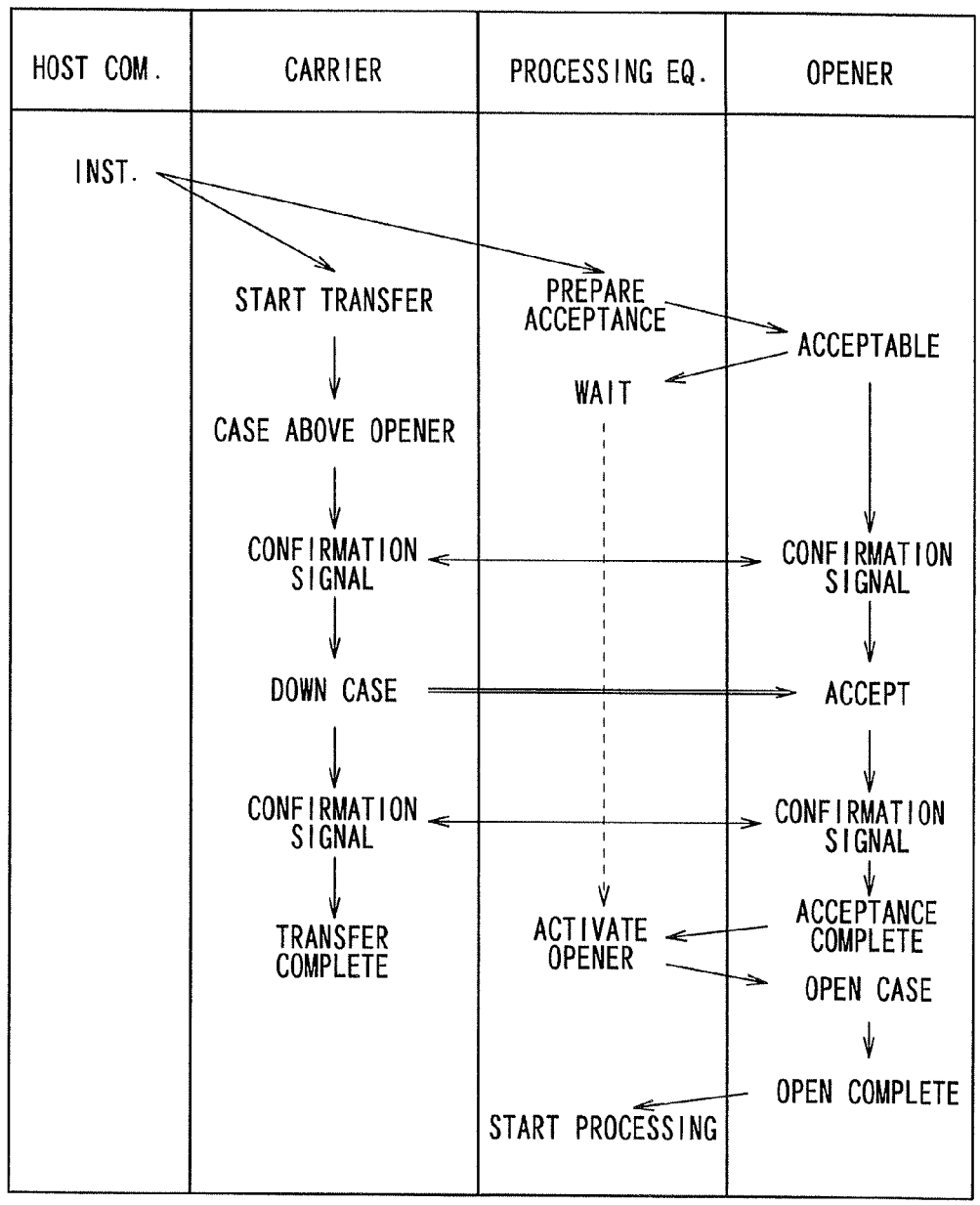
FIG. 2 is a chart showing a status transition of the carrier system.

In FIG. 2, a host computer first sends a transfer instruction signal to the carrier 40 and the processing equipment unit 10 to transfer the case 30. In response to the transfer instruction signal, the carrier 40 starts transfer of the case 30, and the processing equipment unit 10 starts preparation to accept a carried object. Further, the processing equipment unit 10 sends a signal to the opener 20 to start preparation for accepting the case 30.

When receiving a signal from the opener 20 and being notified that the opener 20 is ready to accept the case 30, the processing equipment unit 10 moves into a waiting state. When the processing equipment unit 10 is not ready to accept the case 30 or when the processing equipment unit 10 does not receive the signal indicating that the opener 20 is ready to accept the case 30, the processing equipment unit 10 sends a signal to the host computer to terminate transfer. In this case, the host computer once terminates transfer of the carried object for a predetermined period. Subsequently, the host computer sends the signal to the carrier 40 and the processing equipment unit 10 to start transfer again. In this way, the host computer repeats sending of the signal until the processing equipment unit 10 stops sending of the signal to the host computer to terminate transfer.

When receiving the signal from the host computer to start transfer, the carrier 40 starts moving along the rail 50 to transfer the case 30. When arriving at a location directly above the opener 20, the carrier 40 performs optical communication with the optical communication unit 51 of the rail 50 thereby to exchange transfer confirmation signals with the opener control panel 21 via the optical communication unit 51. In this case, the transfer confirmation signals are exchanged to determine whether the opener 20 is ready to accept the case 30. When the opener 20 is ready to accept the case 30, the carrier 40 reels out the suspension unit 41 thereby to lower the case 30 and mount the case 30 onto the opener 20.

Subsequently, the carrier 40 exchanges transfer confirmation signals with the opener control panel 21 via the optical communication unit 51. In this case, the transfer confirmation signals are exchanged for determining whether the case 30 is securely mounted on the opener 20. When receiving a signal from the opener control panel 21 and being notified that the case 30 is mounted on the opener 20, the carrier 40 detaches the holder unit from the flange and raises the suspension unit 41. Thus, the carrier 40 completes transfer of the case 30.

The opener control panel 21 may be coupled with multiple sensors to detect a state where the case 30 is mounted at a predetermined position of the opener 20 to interrupt an optical signal. In this case, when the sensors detect that the case 30 interrupts the optical signal, the opener control panel 21 sends a signal to notify the carrier 40 that the case is mounted at the predetermined position.

Subsequently, when receiving a signal from the opener control panel 21 and being notified that acceptance of the case 30 is completed, the processing equipment unit 10 sends an open signal to the opener control panel 21 to open the case 30. Thus, the processing equipment unit 10 activates the opener 20 to perform an opening operation of the lid of the case 30. Subsequently, when receiving a signal from the opener control panel 21 and being notified that the opening operation of the case 30 is completed, the processing equipment unit 10 removes the carried object from the case 30. Subsequently, the processing equipment unit 10 performs a predetermined manufacturing process on the carried object in the processing chamber 11.

Thereafter, the processing equipment unit 10 stores the carried object in the case 30 and sends a signal to the opener control panel 21 to close the case 30 (illustration of the present procedure is omitted). Subsequently, the carrier 40 exchanges transfer confirmation signals with the opener control panel 21, similarly to the case where the case 30 is mounted on the opener 20. The carrier 40 lowers the suspension unit 41, secures the holder unit to the flange of the case 30, and raises the case 30.

According to the present embodiment, the carrier system includes, the opener 20 equipped with the opener control panel 21 configured to control elevation of the case 30. The carrier 40 exchanges the transfer confirmation signals with the opener control panel 21 thereby to mount the case 30 on the opener 20.

The processing equipment unit 10 may be replaced due to, for example, change in the diameter of a carried object such as a silicon wafer from 300 millimeters to 200 millimeters. In such a case, the opener is usable irrespective of the processing equipment unit. That is, the conventional opener 20 may be applied to a new processing equipment unit. Therefore, a new processing-equipment control panel for controlling elevation of the case 30 need not be produced for a new processing equipment unit. Thus, overall cost may be reduced when a new processing equipment unit is inserted.

(Second Embodiment)

Figure 3:
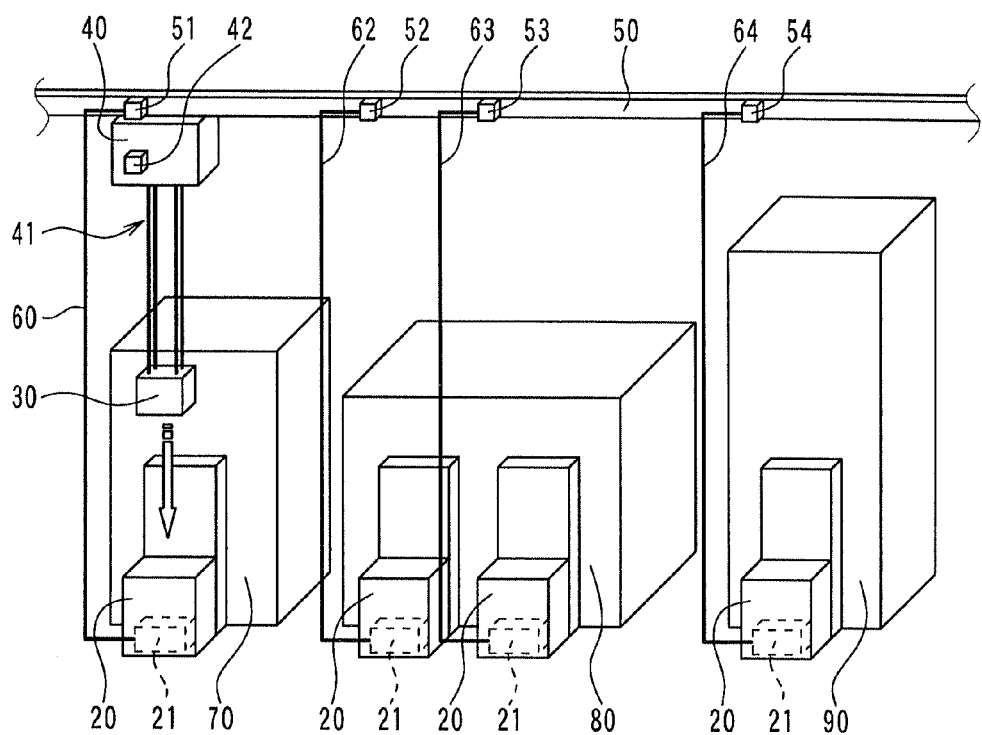
FIG. 3 is a perspective view showing a carrier system according to a second embodiment.

As follows, the second embodiment of the present invention will be described with reference to FIG. 3. The carrier system in the present embodiment includes multiple processing equipment units and openers 20. The configuration of the carrier system otherwise is the same as that of the first embodiment.

The carrier system according to the present embodiment includes multiple processing equipment units 70 to 90 and multiple openers 20. The processing equipment units 70 to 90 are configured to perform different manufacturing processes. The openers 20 are respectively integrated with the processing equipment units 70 to 90. Each of the openers 20 includes an opener control panel 21 for controlling elevation of the case 30. The openers 20 are identical and have a common configuration. The openers 20 are, for example, secured by screws or other fasteners to the processing equipment units 70 to 90. The rail 50 is equipped with optical communication units 51 to 54 respectively located above the openers 20. Each of the optical communication units 51 to 54 is configured to be paired with the optical communication unit 42.

With regard to the present carrier system equipped with the processing equipment units 70 to 90, it suffices that each of the processing equipment units 70 to 90 is equipped with a like opener 20. Therefore, each of the processing equipment units 70 to 90 need not be equipped with a unique processing-equipment control panel including the control unit 100 for controlling elevation of the case 30. Thus, the cost can be reduced in a case where multiple processing equipment units 70 to 90 are provided in the carrier system. In addition, the openers 20 are usable irrespective of the particular processing equipment units. Therefore, even when the processing equipment units 70 to 90 are replaced, a similar operation effect to that of the first embodiment can be produced.

According to the present embodiment, the processing equipment unit 80 includes two openers 20. In the present configuration, for example, while the processing equipment unit 80 performs a predetermined manufacturing process in the processing chamber, one of the openers 20, which is not mounted with the case 30, may be mounted with a subsequent case 30 in advance. In this way, efficiency of transfer can be enhanced. The processing equipment unit 80 may be configured to perform a predetermined process when both the openers 20 are respectively mounted with cases 30 each accommodating a carried object.

(Other Embodiment)

It is noted that the carrier 40 is not limited to an OHT cited as an example in the first embodiment. The carrier 40 may be, for example, a rail guided vehicle (RGV) configured to move along a rail on the factory floor. Alternatively, the carrier 40 may be, for example, an automatic guided vehicle (AGV) configured to track on a guide device such as a guide tape on the factory floor.

Summarizing the above embodiments, a carrier system includes a processing equipment unit 10, 70 to 90 configured to perform a predetermined process on a carried object; a carrier 40 configured to carry a carried object accommodated in a case 30; and an opener 20 equipped to the processing equipment unit 10, 70 to 90 and configured to enable the carrier 40 to mount the case 30 on the opener 20. The opener 20 includes an opener control panel 21. The opener control panel 21 includes a control unit 100 configured to exchange a signal with the carrier 40 to control elevation (upward and downward movement) of the case 30. The carrier 40 is further configured to exchange a signal with the opener control panel 21 to mount the case 30 on the opener 20.

In the present configuration of the carrier system, the opener 20 is equipped with the opener control panel 21 for controlling elevation of the case 30. That is, the opener 20 is a separate component from the opener control panel 21 and is detachable relative to the opener control panel 21. In addition, the carrier 40 is configured to exchange a signal with the opener control panel 21 thereby to mount the case 30 on the opener 20. Therefore, even when a conventional processing equipment unit 10, 70 to 90 is replaced with a new processing equipment unit, the opener 20 is usable irrespective of the processing equipment unit. That is, the opener 20, which is equipped to the conventional processing equipment unit, may be reused for the new processing equipment unit. Thus, a new processing-equipment control, panel, which includes the control unit 100 for controlling elevation of the case 30, need not be provided to the new processing equipment unit when the conventional processing equipment unit is replaced with the new processing equipment unit. Consequently, cost can be restrained when the new processing equipment unit is installed.

Alternatively, the carrier system may include multiple processing equipment units 10, 70 to 90. In this case, the same opener 20 may be equipped to each of the processing equipment units 10, 70 to 90. Therefore, each of the processing equipment units 10, 70 to 90 need not be equipped with its own processing-equipment control panel including a control unit for controlling elevation of the case 30. Thus, cost can be restrained in a case where the carrier system includes multiple processing equipment units 10, 70 to 90.

For example, the carrier 40 may be equipped with an optical communication unit 42. The carrier 40 may be movable along a rail 50, which is located at a place including a position directly above the opener 20. The rail 50 may be equipped with an optical communication unit 51 configured to exchange a signal with the optical communication unit 42 of the carrier 40 and to exchange a signal with the opener control panel 21. The carrier 40 may be configured to exchange a signal with the opener control panel 21 via the optical communication unit 51 of the rail 50 thereby to mount the case 30 on the opener 20.

The above structures of the embodiments can be combined as appropriate. The above processes such as calculations and determinations may be performed by any one or combination of software, an electric circuit, a mechanical device, and the like. The software may be stored in a storage medium, and may be transmitted via a transmission device such as a network device. The electric circuit may be an integrated circuit, and may be a discrete circuit such as a hardware logic configured with electrical or electronic elements or the like. The elements producing the above processes may be discrete elements and may be partially or entirely integrated.

It should be appreciated that while the processes of the embodiments of the present invention have been described herein as including a specific sequence of steps, further alternative embodiments including various other sequences of these steps and/or additional steps not disclosed herein are intended to be within the steps of the present invention.

Various modifications and alternations may be diversely made to the above embodiments without departing from the spirit of the present invention.

What is claimed is:

1. A carrier system comprising:
   a processing equipment unit configured to perform a predetermined process to a carried object;

a carrier configured to carry a carried object accommodated in a case; and an opener equipped to the processing equipment unit and configured to be mounted with the case from the carrier, wherein the opener includes an opener control panel configured to exchange a signal with the carrier to control elevation of the case, the carrier is further configured to exchange a signal with the opener control panel to mount the case on the opener, the carrier is equipped with a carrier-optical communication unit and is movable on a rail equipped at a position including directly above the opener, the rail is equipped with a rail-optical communication unit configured to exchange a signal with the carrier-optical communication unit and to exchange a signal with the opener control panel, the carrier is configured to exchange a signal with the opener control panel via the rail-optical communication unit equipped to the rail to mount the case on the opener, and the opener control panel is integrated with the opener;

wherein the processing equipment unit includes a processing control unit which is different from the opener control panel of the opener;

wherein the opener is detachable relative to the processing equipment unit;

wherein the processing equipment unit comprises a processing unit for processing wafers;

wherein instructions for performing the control elevation of the case are stored in the opener control panel and instructions for performing the predetermined process to the carried object are separately stored in the processing control unit;

wherein communication between the processing equipment unit and the opener comprises:

sending a signal from the opener control panel to the processing control unit indicating acceptance of the case, and sending an open signal from the processing control unit to the opener control panel to open the case;

wherein the processing equipment unit is configured to perform the predetermined process after the case is opened; and wherein when the processing equipment unit is detached and a subsequent processing equipment is attached, the carrier and the opener are configured to continue performing the control elevation.

2. The carrier system according to claim 1, wherein the opener control panel is mounted to the opener.

3. The carrier system according to claim 1, wherein the opener including the opener control panel is configured to be usable irrespective of the processing equipment unit.

* * * * *